United States Patent [19]

Baba

[11] Patent Number: 4,574,203

[45] Date of Patent: Mar. 4, 1986

[54] CLOCK GENERATING CIRCUIT PROVIDING A BOOSTED CLOCK SIGNAL

[75] Inventor: Fumio Baba, Kawasaki, Japan

[73] Assignee: Fujitsu Limited, Kawasaki, Japan

[21] Appl. No.: 502,570

[22] Filed: Jun. 9, 1983

[30] Foreign Application Priority Data

Jun. 30, 1982 [JP] Japan ................... 57-111532

[51] Int. Cl.[4] .............................................. H03K 5/02
[52] U.S. Cl. .................... 307/269; 307/482; 307/578; 307/579
[58] Field of Search ............... 307/269, 482, 572, 577, 307/578, 579, 584, 585

[56] References Cited

U.S. PATENT DOCUMENTS

| 4,061,933 | 12/1977 | Schroeder et al. | 307/262 |
| 4,382,194 | 5/1983 | Nakano et al. | 307/264 |
| 4,388,538 | 6/1983 | Ikeda | 307/482 |

FOREIGN PATENT DOCUMENTS 2851825 12/1980 Fed. Rep. of Germany.

OTHER PUBLICATIONS

IBM Technical Disclosure Bulletin, vol. 18, No. 2, Jul. 1975, New York, pp. 467–468, M. Cukier: "Push-Pull Circuit".

*Primary Examiner*—John S. Heyman

*Attorney, Agent, or Firm*—Staas & Halsey

[57] ABSTRACT

A clock generating circuit includes a switch control circuit controlling a C-MOS circuit including first and second transistors having first and second conductivity types, respectively. Also included in the clock generating circuit is a bootstrap capacitor having a first end connected to the junction between the first and second transistors. The switch circuit includes a third transistor, having the first conductivity type, connected between the gate of the first transistor and the junction between the first and second transistors, and a fourth transistor, having the second conductivity type, connected between the gates of the first and second transistors. The gate of the second transistor is connected to receive an input clock signal and the gates of the third and fourth transistors are connected together to receive a delayed clock signal produced by delaying the input clock signal. The second end of the bootstrap capacitor is connected to receive a further delayed and inverted clock signal. When the delayed clock signal has a first value, the switching circuit connects the gates of the first and second transistors together and an output signal with a first level is produced at the junction of the first and second transistors. When the delayed clock signal reaches a second level, the switching circuit connnects the gate of the first transistor to the junction of the first and second transistors and the bootstrap capacitor boosts the output signal to a second level.

10 Claims, 5 Drawing Figures

Fig. 3
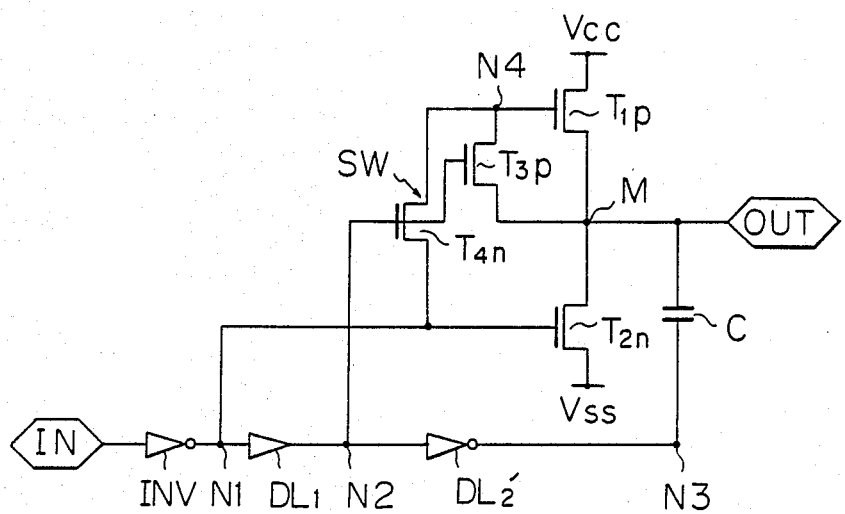
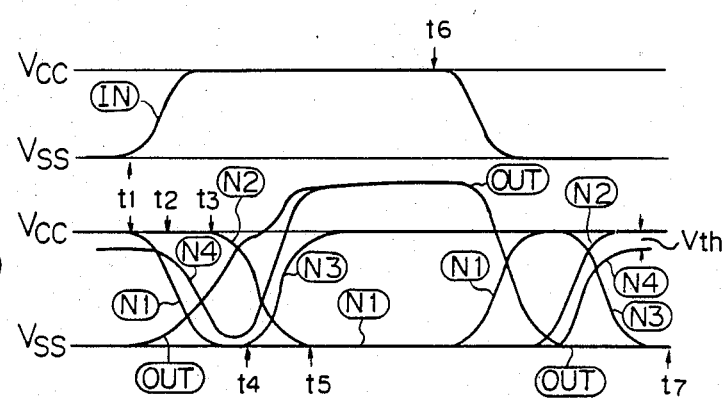
Fig. 4(A)
Fig. 4(B)

CLOCK GENERATING CIRCUIT PROVIDING A BOOSTED CLOCK SIGNAL

BACKGROUND OF THE INVENTION

1. Field of the Invention

The present invention relates to a clock generating circuit, more particularly to a clock generating circuit which boosts the voltage level of an input clock higher than the voltage level of a power source, thereby producing a boosted output clock.

2. Description of the Prior Art

Usually, in semiconductor circuits driven by power sources, the signals appearing in the circuits cannot have voltage levels higher than that of the power sources. Along with recent improvements in the characteristics of semiconductor circuits, however, a strong demand has arisen for some signals appearing in the circuit to have a voltage level higher than that of the power source.

For example, in a dynamic memory and the like, it has been proposed to raise the level of the signal to be applied to each word line higher than the power source voltage level, thus increasing the amplitude of current flowing from the selected memory cell to the corresponding bit line and enabling perfect read and write data operations.

Generally speaking, this can be effected by a clock generating circuit which receives an input clock and produces an output clock having a voltage level higher than the power source voltage. The present invention concerns such a clock generating circuit.

There are problems, however, with the prior art clock generating circuit. First, it is not easy to drive the circuit with low power. Second, it is difficult to achieve high speed operation.

SUMMARY OF THE INVENTION

It is a object of the present invention to provide a clock generating circuit with a raised output which operates at a high speed with low driving power.

The above object is attained by a basic construction in which a switch circuit is incorporated into a transistor pair of a first channel type and a second channel type, the pair forming a complementary metal oxide semiconductor (C-MOS) circuit. The switch circuit can create a first state and a second state selectively. In the first state, a junction point between the first and second channel type transistors and the gate of the first channel type transistor are connected. In the second state, the above connection is released and, at the same time, the gates of these transistors are connected.

BRIEF DESCRIPTION OF THE DRAWINGS

The present invention will be more apparent from the ensuing description with reference to the accompanying drawings, wherein:

FIG. 3 is a circuit diagram of a clock generating circuit according to an embodiment of the present invention;

FIG. 4 depicts waveforms used for explaining the operation of the clock generating circuit in FIG. 3.

DESCRIPTION OF THE PREFERRED EMBODIMENT

Figure 1:
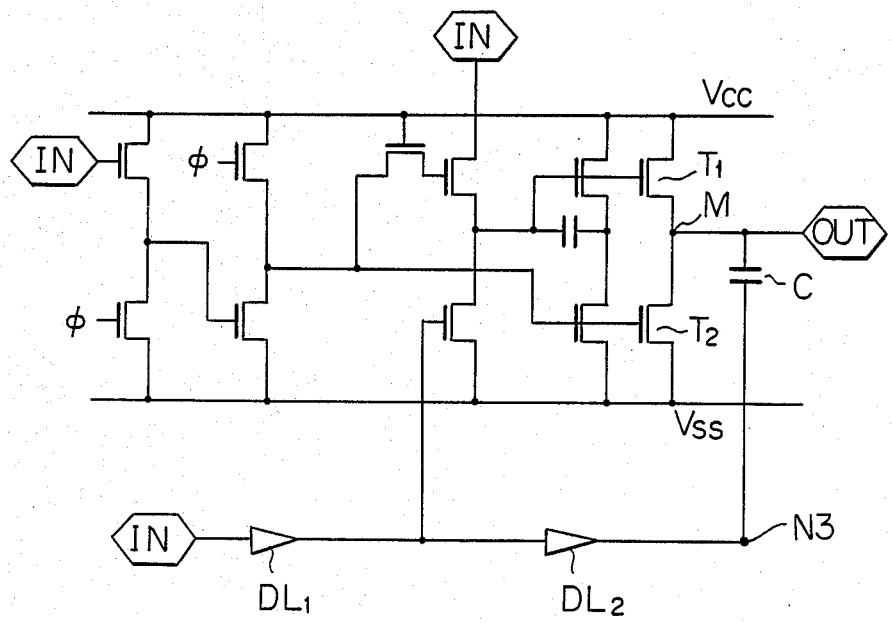
FIG. 1 is a circuit diagram of a prior art clock generating circuit.

Before describing the preferred embodiments, a discussion will be made of the prior art clock generating circuit for reference purposes. FIG. 1 is a circuit diagram of the prior art. Since the clock generating circuit of FIG. 1 is well known, only a brief explanation of its operation will be given herein. A clock generating circuit similar to the FIG. 1 is disclosed by U.S. Pat. No. 4,061,933, especially illustrated in FIG. 3 thereof.

In FIG. 1, particular attention should be paid to first transistor $T_1$ and second transistor $T_2$ in the last stage of the circuit, which are connected in series between a first power source $V_{cc}$ and a second power source $V_{ss}$. An output clock signal OUT responding to an input clock signal IN is produced, with the aid of a bootstrap capacitor C, from a junction point M between the first and second transistor $T_1$ and $T_2$. In this figure, the reference symbol $\phi$ denotes a precharging clock signal and $DL_1$ and $DL_2$ represent delay circuits.

For a period of time, the first transistor $T_1$ is on (the second transistor $T_2$ is off), and therefore, the bootstrap capacitor C is charged up to about the $V_{cc}$ level. Thereafter, the voltage level at the low potential end N3 of the bootstrap capacitor C is boosted by the input clock signal IN which is transferred to the capacitor's low potential end N3 via the delay circuits $DL_1$ and $DL_2$. Thus, a voltage level higher than the $V_{cc}$ level can be obtained in the output clock signal OUT.

The above-mentioned clock generating circuit of the prior art and other clock generating circuits of the prior art similar thereto are usually comprised of a single channel type of transistor. That is, as seen from the circuit of FIG. 1, all the transistors are of a single channel type, i.e, all n-channel and none p-channel. When all transistors are made of the same single channel type, DC current paths are inevitably formed between the power sources $V_{cc}$ and $V_{ss}$. These DC current paths clearly are disadvantageous in terms of driving with low power. Further, looking at the first transistor $T_1$, since the source is connected to the output of the circuit, the so-called substrate bias effect in the transistor $T_1$ becomes non-negligible with the increase of the voltage level at the output due to the charging of the bootstrap capacitor C, resulting in a gradual increase in the threshold voltage $V_{th}$ of the transistor $T_1$. When the threshold voltage $V_{th}$ increases, the mutual conductance $g_m$ of the first transistor $T_1$ decreases. As a result, the current supplying capability of the transistor $T_1$ is reduced. This leads to a reduction of the operation speed.

A C-MOS circuit can be driven with low power and prevents a reduction of the current supplying capability. It is impossible, however, to simply replace the first and second transistor $T_1$ and $T_2$ of FIG. 1 with a C-MOS circuit for two reasons.

First, a C-MOS circuit would be formed by a p-channel transistor $T_1$ and an n-channel transistor $T_2$, which correspond to the first and second transistor $T_1$ and $T_2$, respectively. In this case, it is not easy to turn off the p-channel transistor when the voltage level of the output clock signal OUT exceeds the level of the first power source $V_{cc}$. This is because a gate voltage of a level higher than the source voltage is needed at the gate of a p-channel transistor when such a transistor is to be turned off. Such a gate voltage is not obtainable in the circuit and must be supplied from outside the circuit.

Second, a new circuit must be employed for turning off both the p-channel and n-channel transistors after the level of the output clock signal OUT exceeds the power source level. Although the use of a C-MOS circuit is not advantageous in view of the above-mentioned two reasons, there still is an advantage in using a p-channel transistor for transistor $T_1$. Since the source of the p-channel transistor is connected to the first power source $V_{cc}$, no substrate bias effect is induced. Accordingly, no increase of the threshold voltage $V_{th}$ occurs and there is no gradual reduction of the current supplying capability.

According to the present invention, the clock generating circuit is fabricated by utilizing C-MOS circuits without causing the aforementioned problems. That is, the p-channel transistor can be turned off without having to introduce a gate voltage higher than the power source level. Also, both the p-channel and n-channel transistors can be turned off simultaneously without having to employ a new circuit. Thus, the present invention provides a clock generating circuit which effectively enables driving with low power and prevents reduction of the current supplying capability.

Figure 2:
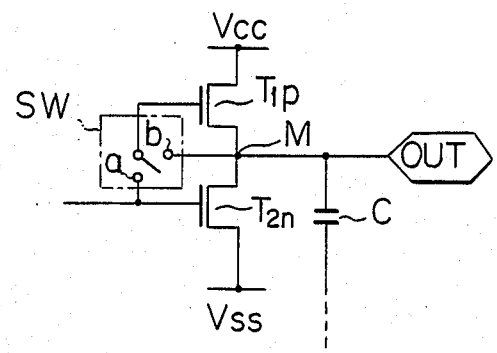
FIG. 2 is a circuit diagram of the most important part of the clock generating circuit according to the present invention.

FIG. 2 is a circuit diagram illustrating the most important part of the clock generating circuit according to the present invention. The first power source $V_{cc}$, the second power source $V_{ss}$, the bootstrap capacitor C, the output clock signal OUT and the junction point M are substantially the same as those of FIG. 1. However, the first transistor $T_1$ and the second transistor $T_2$ of FIG. 2 are modified in to a p-channel first transistor $T_{1p}$ and an n-channel second transistor $T_{2n}$, respectively, which are arranged in the form of a C-MOS circuit.

The previously mentioned switch circuit is represented by reference characters SW. The switch circuit SW is provided with contacts a and b. In operation, first the contact a is closed. Therefore, a usual C-MOS circuit is formed by the transistors $T_{1p}$ and $T_{2n}$. Once the voltage level of the output clock signal OUT exceeds the level of the first power source $V_{cc}$, the contact b is closed. Thus, the high voltage appearing at the drain side of the p-channel transistor $T_{1p}$ is transferred, via the contact b, to its gate, thus turning off the transistor $T_{1p}$. It should be noted that the p-channel transistor $T_{1p}$ can be turned off without having to apply to its gate an external voltage higher than the level of the first power source $V_{cc}$.

The reason why the transistor $T_{1p}$ must be turned off after the level of the output clock signal OUT rises above the level of the first power source $V_{cc}$, is that if it were left on, the level of the output clock signal OUT would no longer be higher than the level of the first power source $V_{cc}$. This is because, if the transistor $T_{1p}$ is still on, the level of the output clock signal OUT will be equalized to the level of the first power source $V_{cc}$ through the conductive transistor $T_{1p}$ as soon as the level of the output clock signal OUT reaches the $V_{cc}$ level.

The above also applies to the second transistor $T_{2n}$ connected to the second power source $V_{ss}$. The transistor $T_{2n}$ must also be turned off, i.e., both the first transistor $T_{1p}$ and the second transistor $T_{2n}$ must be off. Therefore, the voltage level of the second power source $V_{ss}$ must be applied to the gate of the transistor $T_{2n}$.

Summarizing the above explanations with reference to FIG. 2, the first and second transistors $T_{1p}$ and $T_{2n}$ from a C-MOS circuit when contact a is closed, and driving with low power can be achieved. Second when the level of the output clock signal OUT rises above the level of the first power source $V_{cc}$, both the first and second transistors $T_{1p}$ and $T_{2n}$ can be turned off simultaneously. Third, the first transistor $T_{1p}$ can be turned off, not by applying an external voltage, but by using the increased voltage of the output clock signal OUT.

Fourth, since transistor $T_{1p}$ is a p-channel transistor, its source is connected to the first power source $V_{cc}$. Accordingly, the aforesaid substrate bias effect is not induced and the threshold voltage $V_{th}$ does not increase. This means that an overdrive between the gate and the source of the p-channel transistor can easily be performed, and therefore, the current supplying capacity of the output clock signal OUT can be large. This results in an increase in the operation speed.

In conclusion, the clock generating circuit of the present invention exhibits at least the above-mentioned four functions which are not exhibited in the prior art clock generating circuit.

FIG. 3 is a circuit diagram of a clock generating circuit according to an embodiment of the present invention. In FIG. 3, a p-channel third transistor $T_{3p}$ and an n-channel fourth transistor $T_{4n}$ form a specific structure for realizing the switch circuit SW shown in FIG. 2. The remaining structure is substantially the same as that explained before.

The operation of the clock generating circuit will be explained with reference to the waveforms of FIG. 4. First, the level of the input clock signal IN rises at the time t1 as shown by a curve IN in FIG. 4(A). The output clock signal IN is inverted by the inverter INV, as shown by the curve N1 in FIG. 4(B) which represents the voltage waveform appearing at node N1. At time $t_1$, the voltage level at node N2 is still maintained at the level of the power source $V_{cc}$. Therefore, the fourth transistor $T_{4n}$, is on. Since transistor $T_{4n}$, is conductive, the voltage at node N1 is transferred to node N4. The voltage level at node N1 is falling to the level of the second power source $V_{ss}$. Accordingly, the voltage level at node N4 falls, after time t2, as shown by curve N4 in FIG. 4(B).

After a delay due to the delay circuit $DL_1$, the voltage level at node N2 starts following the fall of the voltage level of node N1 at time t3 as shown by curve N2 in FIG. 4(B). In accordance with the level changes mentioned above, the first transistor $T_{1p}$ is turned on and the second transistor $T_{2n}$ is turned off by time t3. The output clock signal OUT rises as shown by the curve OUT in FIG. 4(B) after time t1 due to the charging of the bootstrap capacitor C.

The above-mentioned level change between IN and OUT is then established by the usual C-MOS circuit operation. During the period from time t2 to t3, the voltage level at the node N4 falls. Between time t3 and time t5, the voltage level at the node N2 falls. At approximately time t4, the voltage level at node N2 falls below the level of the output signal OUT by an amount equal to the threshold voltage of transistors $T_{3p}$ and $T_{4n}$, with the result that the third transistor $T_{3p}$ is turned on, while the fourth transistor $T_{4n}$ is turned off. (This corresponds to the state, in FIG. 2, where the contact b in the switch circuit SW is closed.) After the third transistor $T_{3p}$ turns on, the output clock signal OUT is transferred to node N4, represented by the rise of curve N4 after time t4 in FIG. 4(B). From time t5 to time t7, node N4 and the output clock signal OUT have the same voltage level. Thus, the voltage level at node N4 is raised past the level of the first power source $V_{cc}$, and accordingly, the first transistor $T_{1p}$ is turned off. Consequently, the second transistor $T_{2n}$, which has been off since time t3, and the first transistor $T_{1p}$ are both off.

Starting at time t4, the level at node N3 rises, with a delay due to the delay circuit $DL_2'$ (this circuit has functions of both delay and level inversion), represented by curve N3 in FIG. 4(B). The rise in level at node N3 boosts the level at the low potential end of the bootstrap capacitor C. As a result, the level of the output clock signal OUT is boosted higher than the level of the first power source $V_{cc}$ (refer to the curve OUT in FIG. 4(B), which starts rising near the time t1). Thereby, the desired output clock signal OUT having a voltage level higher than that of the input clock signal IN, is obtained.

The input clock signal IN falls after time t6, while the level at node N1 rises and is maintained at about the level of the first power source $V_{cc}$. At this time (slightly after time t6), the second transistor $T_{2n}$ is turned on and discharges the capacitor C. Therefore, the level of the output clock signal OUT falls toward the level of the second power source $V_{ss}$. Following this, near time t7, the level at node N2 rises again with a delay due to the delay circuit $DL_1$. Then, the fourth transistor $T_{4n}$ is turned on, while the third transistor $T_{3p}$ is turned off, which corresponds to the state, in FIG. 2, where the contact a is closed and usual C-MOS circuit operation is achieved.

After time t7, due to the nonconductive third transistor $T_{3p}$ and the conductive fourth transistor $T_{4n}$, the level at node N4 rises as the level at node N2 rises. However, the voltage level at node N4 is reduced by the amount of the threshold voltage $V_{th}$ (refer to FIG. 4(B)) of the fourth transistor $T_{4n}$. Further, the level at node N3 falls due to the presence of the delay/inverter circuit $DL_2'$. The state created after time t8 in FIG. 4(B) is equivalent to the state created before time t1 and an identical operation is repeated thereafter.

In the above explanation, the voltage level at the low potential end N3 of the bootstrap capacitor C is boosted and the output clock signal OUT is raised to a level higher than the level of the first power source $V_{cc}$. This is also true of the opposite case. That is, when the voltage level at the low potential end N3 of the bootstrap capacitor C is pulled down, a output clock signal OUT having a level lower than zero volts can be obtained. In this case, it is necessary to switch the connections of the first power source $V_{cc}$ with the second power source $V_{ss}$ having a zero volts level, and switch the p-channel transistors and n-channel transistors. Also, the waveform of the input clock signal IN in FIG. 4(A) would be transformed to a waveform which first falls from the level of the first power source $V_{cc}$ to the zero volts level of the second power source $V_{ss}$ and then rises to the level of the first power source $V_{cc}$ again.

Figure 5:
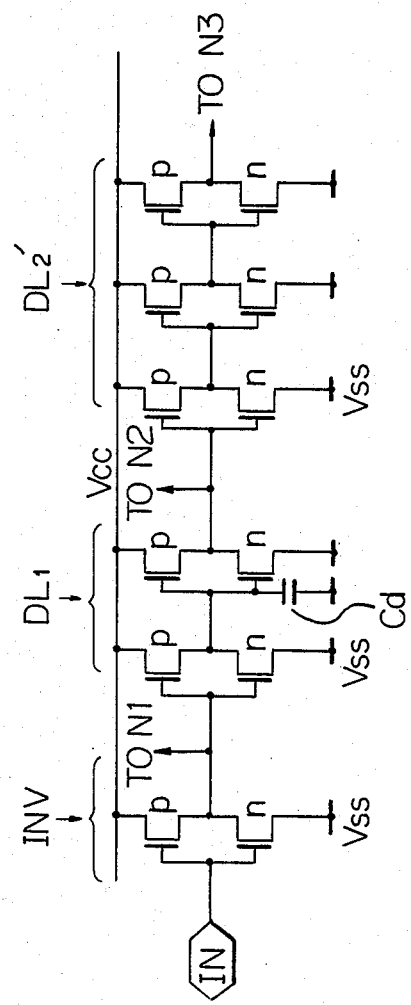
FIG. 5 is a circuit diagram of the inverter and delay circuits in FIG. 3.

FIG. 5 is a circuit diagram of a specific example of the inverter INV and the delay circuits $DL_1$ and $DL_2'$ shown in FIG. 4. As seen in FIG. 5, these are basically a combination of C-MOS inverters. Corresponding portions are referenced by INV, $DL_1$, and $DL_2'$. A delay capacitor $C_d$ in the circuit $DL_1$ may be used, if necessary. Further, since the circuit $DL_2'$ has functions of not only delay but also level inversion, it is composed of an odd number of C-MOS inverter stages. In FIG. 5, a three-stage C-MOS inverter is illustrated.

As explained above in detail, according to the present invention, a clock generating circuit is realized which is suitable for low power driving and which does not reduce the current supplying capability.

I claim:

1. A clock generating circuit, operatively connected to first and second voltage sources, having a voltage difference therebetween, and receiving an input clock signal, said circuit comprising:
   a first transistor of a first channel type, operatively connected to the first voltage source and having a gate;
   a second transistor of a second channel type, operatively connected in series with said first transistor, forming a junction point therebetween, and to the second voltage source, and having a gate;
   a first delay circuit, operatively connected to receive the input clock signal, for producing a delayed clock signal by delaying the input clock signal by a predetermined time delay;
   a bootstrap capacitor, having a first end operatively connected to the junction point between said first and second transistors and to the output of said first delay circuit and having a second end, said bootstrap capacitor being charged to a level nearly the same as the level of said first voltage source by turning on said first transistor and turning off said second transistor, the voltage level of said bootstrap capacitor being changed by the input delayed clock signal, output by said first delay circuit, during the charging of said bootstrap capacitor, thereby producing at the second end of said bootstrap capacitor an output clock signal having first and second voltage levels with a difference therebetween which is larger than the voltage difference between the first and second voltage sources; and
   a switch circuit, operatively connected to the input of said first delay circuit, the gates of said first and second transistors and the junction point, for connecting the gate of said first transistor with the junction point only for a period of time during which the voltage level of said bootstrap capacitor is changed by the delayed clock signal, and otherwise connecting the gate of said first transistor with the gate of said second transistor.

2. A clock generating circuit as set forth in claim 1, wherein said switch circuit comprises:
   a third transistor of the first channel type, operatively connected to the gate of said first transistor, the junction point and the output of said first delay circuit; and
   a fourth transistor of the second channel type, operatively connected to the gates of said first and second transistors and the input of said first delay circuit.

3. A clock generating circuit as set forth in claim 2, further comprising:
   an inverter having an output operatively connected to the gate of said second transistor, said fourth transistor, the input of said first delay circuit and an input operatively connected to receive the input clock signal; and
   a second delay circuit, having an input operatively connected to the output of said first delay circuit and an output operatively connected to said bootstrap capacitor, for delaying and inverting.

4. A clock generating circuit as set forth in claim 3,
wherein said inverter, said first delay circuit and said second delay circuit are C-MOS inverters, each comprising at least one pair of transistors, one of the transistors of each pair of the first channel type and the other transistor of the second channel type, and
wherein said second delay circuit comprises an odd number of C-MOS inverter stages, which provide the level inverting function.

5. A clock generating circuit as set forth in claim 4, wherein said first delay circuit further comprises a delay capacitor.

6. A clock generating circuit, operatively connected to first and second voltage sources having levels with a difference therebetween, receiving an input clock signal, said circuit comprising:
a first transistor of a first conductivity type operatively connected to the first voltage source;
a second transistor of a second conductivity type, operatively connected to the second voltage source and said first transistor, forming a junction point between said first and second transistors;
delay means, having an input operatively connected to receive the input clock signal and having an output, for delaying the input clock signal;
a bootstrap capacitor operatively connected to the output of said delay means and the junction point between said first and second transistors; and
switching means, operatively connected to the input of said delay means, the junction point and said first and second transistors, for turning said first and second transistors on and off, and producing at one end of said bootstrap capacitor an output clock signal having third and fourth voltage levels with a difference therebetween which is larger than the difference between the levels of the first and second voltage sources.

7. A clock generating circuit as set forth in claim 6,
wherein said delay means has a partially delayed output, and
wherein said switching means comprises:
a third transistor of the first conductivity type, operatively connected to said first transistor, the junction point and the partially delayed output of said delay means; and
a fourth transistor of the second conductivity type, operatively connected to said first and second transistors and the input of said delay means.

8. A clock generating circuit as set forth in claim 7, wherein said delaying means comprises:
an inverter having an output operatively connected to said second transistor and having an input operatively connected to receive the input clock signal;
a first delay circuit having an input operatively connected to the output of said inverter and said fourth transistor and an output operatively connected to said third transistor; and
a second delay circuit, having an input operatively connected to the output of said first delay circuit and having an output operatively connected to said bootstrap capacitor, for delaying and inverting.

9. A clock generating circuit as set forth in claim 8,
wherein said first conductivity type is a P-channel field effect type, said second conductivity type is a N-channel field effect type and the level of the first voltage source is higher than the level of the second voltage source,
wherein said first delay circuit generates a first delayed clock signal and said second delay circuit generates a second delayed clock signal, and
wherein said first and second delay circuits provide delays such that:
when the input clock signal rises, said first transistor is turned on and said second transistor is turned off, thereby charging up said bootstrap capacitor;
when said bootstrap capacitor is charged almost to the level of the first voltage source, the first delayed clock signal falls, turning on said third transistor and turning off said fourth transistor, thereby turning off said first transistor while said second transistor remains off;
when said first transistor substantially turns off, the second delayed clock signal rises, boosting the level of said bootstrap capacitor; and
when the input clock signal thereafter falls, said second transistor is turned on, thereby discharging said bootstrap capacitor.

10. A clock generating circuit as set forth in claim 8,
wherein said first conductivity type is an N-channel field effect type, said second conductivity type is a P-channel field effect type and the level of the first voltage source is lower than the level of the second voltage source,
wherein said first delay circuit generates a first delayed clock signal and said second delay circuit generates a second delayed clock signal, and
wherein said first and second delay circuits provide delays such that:
when the input clock signal falls, said first transistor is turned on, thereby discharging said bootstrap capacitor;
when said bootstrap capacitor is substantially discharged, the first delayed clock signal rises, turning on said third transistor and turning off said fourth transistor, thereby turning off said first transistor;
when said first transistor is substantially turned off, the second delayed clock signal falls, thereby discharging said bootstrap capacitor; and
when said input clock signal rises, said second transistor is turned on, thereby charging up said bootstrap capacitor.

* * * * *